United States Patent
Mandal et al.

(10) Patent No.: US 6,426,651 B1
(45) Date of Patent: Jul. 30, 2002

(54) METHOD AND APPARATUS FOR IMPROVING THE PERFORMANCE OF BUFFERS USING A TRANSLATOR CIRCUIT

(75) Inventors: Subratakumar Mandal, Orangevale; Mirza Jahan, Folsom, both of CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/605,126

(22) Filed: Jun. 28, 2000

(51) Int. Cl.$^7$ .......................................... H03K 19/0175
(52) U.S. Cl. .............................. 326/63; 326/30; 326/87
(58) Field of Search .............................. 326/63, 80, 82, 326/85, 87, 91, 30

(56) References Cited

U.S. PATENT DOCUMENTS 5,751,161 A * 5/1998 Wei et al. ...................... 326/30
6,060,907 A * 5/2000 Vishwanthaiah et al. ..... 326/87
6,127,862 A * 10/2000 Kawasumi ................... 327/112
6,175,928 B1 * 1/2001 Liu et al. ..................... 713/401

* cited by examiner

*Primary Examiner*—Michael Tokar
*Assistant Examiner*—Anh Tran
(74) *Attorney, Agent, or Firm*—Blakely, Sokoloff, Taylor & Zafman LLP

(57) ABSTRACT

According to one aspect of the invention, a method is provided in which an input signal is received at a first node of a buffer. The input signal is strengthened by a factor that corresponds to a control signal. The control signal is derived from an output signal of an impedance control unit that is used to compensate for variations in the buffer's performance conditions. The output signal of the impedance control unit has a range of values corresponding to variations in the buffer's performance conditions. The control signal has a range of values that is larger than the range of values associated with the output signal of the impedance control unit.

25 Claims, 4 Drawing Sheets

| BIT STRENGTH | INPUT (FROM ICU) | OUTPUT (TO PRE-DRIVER) |
|---|---|---|
| 0-8 | 00000-01000 | 00001 |
| 9 | 01001 | 00011 |
| 10 | 01010 | 00111 |
| 11 | 01011 | 01011 |
| 12 | 01100 | 01111 |
| 13 | 01101 | 10011 |
| 14 | 01110 | 10111 |
| 15 | 01111 | 11011 |
| 16 | 10000 | 11111 |
| 17-31 | 10001-11111 | 11111 |

METHOD AND APPARATUS FOR IMPROVING THE PERFORMANCE OF BUFFERS USING A TRANSLATOR CIRCUIT

FIELD OF THE INVENTION

The present invention relates to performance control of integrated circuits. More specifically, the present invention relates to an apparatus, method, and system for improving the performance of buffer circuits using a translator/conversion circuit.

BACKGROUND OF THE INVENTION

Buffer circuits, for example input/output (I/O) buffers are widely used to facilitate the transfer of data and signals from one component or circuit to another component or circuit within a given system. As an example, a processor unit such as a microprocessor may contain a buffer unit that is used to transmit data to and receive data from other components such as memory components or chipset units via buses. Accordingly, the performance of the buffer unit directly affects the performance of the system component and the system as a whole since the speed of data transfer between the different components in the system is one of the factors in measuring the overall performance of any given system or circuitry.

The performance of a buffer circuit or an electronic component can vary based upon variations in the performance conditions or parameters including variations in manufacturing process, operating voltage, and operating temperature, etc. In general, some of the performance characteristics of the buffer circuit or the electronic component that may change due to variations in the operating conditions and process include the clock to output time, input drive current, and output drive current, etc. The term "fast" corner or "FFFF" corner is used to refer to the operation of the buffer circuit at its fastest, strongest performance. The term "slow" or "RSSS" corner is used to refer to the operation of the buffer circuit at its slowest, weakest performance.

Some of the parameters that are used to measure the performance of a buffer circuit are the "TCO_MIN" and "TCO_MAX". TCO_MIN is defined as the minimum clock to output time or the time required in the FFFF corner for a signal to move to the output of the final driver in the buffer with reference to the clock edge which latches the signal into the buffer. The TCO_MAX is defined as the maximum clock to output time or the time required in the RSSS corner for a signal to move to the output of the final driver in the buffer with reference to the clock edge which latches the signal into the buffer. To increase the speed and thus the overall performance of a buffer circuit, the designer would want to design the buffer with high TCO_MIN and low TCO_MAX in order to satisfy the timing equations including the setup equation and the hold margin equation. However, the development of buffer circuits has been limited by the fact that TCOMIN and TCOMAX could not be improved simultaneously on the same design because to improve either of them deteriorates the other. As mentioned above, the RSSS corner and the FFFF corner are the extreme corners in the design simulation. The buffer circuits tend to be slow in the RSSS corner thus making it difficult for the setup equation to be satisfied. In the FFFF corner, however, the buffer circuits can be too fast to satisfy the hold margin equation.

BRIEF DESCRIPTION OF THE DRAWINGS

The features and advantages of the present invention will be more fully understood by reference to the accompanying drawings, in which.

DETAILED DESCRIPTION

Figure 1:
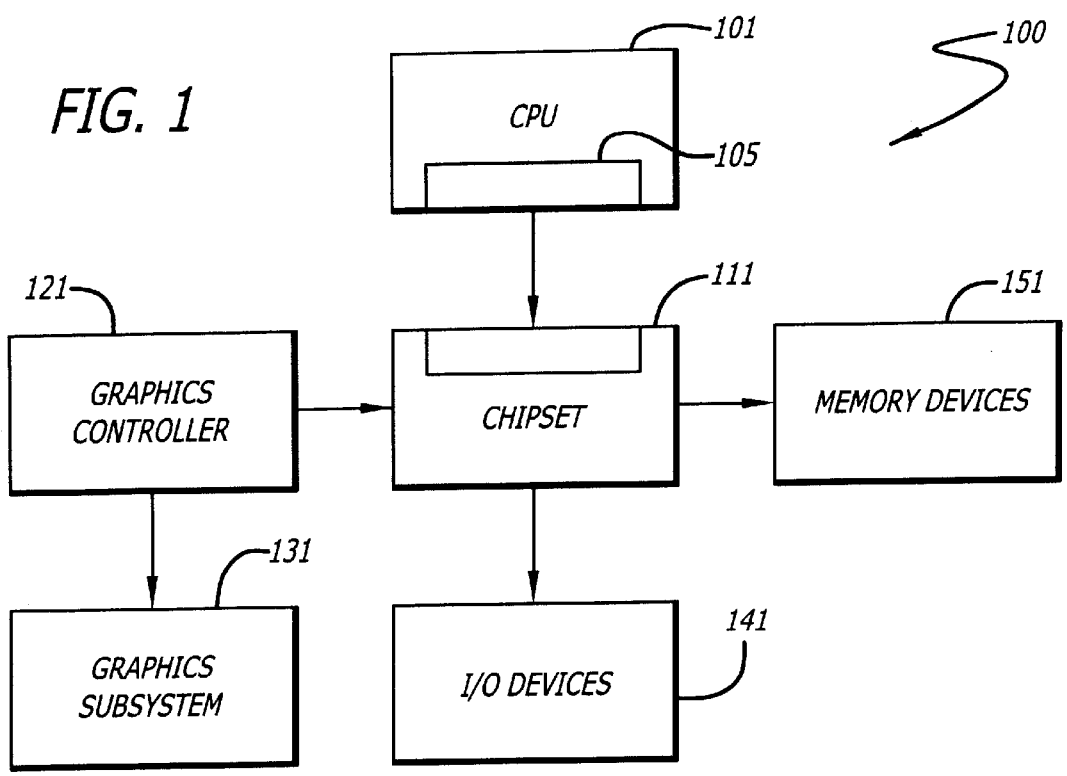
FIG. 1 is a block diagram of one embodiment of a system implementing the teachings of the present invention.

In the following detailed description numerous specific details are set forth in order to provide a thorough understanding of the present invention. However, it will be appreciated by one skilled in the art that the present invention may be understood and practiced without these specific details.

In the discussion below, the teachings of the present invention are utilized to implement a method and apparatus for improving the performance of a buffer under varying performance conditions. In one embodiment, an input signal is received at a first node of the buffer circuit. Before being driven to an output node of the buffer, the input signal is strengthened by a factor corresponding to a control signal. The control signal is derived from an output signal of an impedance control unit (ICU) that is used to compensate for variations in the performance conditions of the buffer. In one embodiment, variations in the buffer's performance conditions include variations in manufacturing process, variations in operating voltage, and variations in operating temperature (PVT). The output signal of the ICU (also referred to as PVT compensation bits) has a first range of values, each of which corresponds to a level of performance conditions. The control signal (also referred to as the amplified PVT compensation bits) has a second range of values that is wider than the first range of values. Accordingly, better control or tracking of the PVT variations can be accomplished by using the control signal. In one embodiment, a lower value in the first range or the second range represents stronger or higher performance conditions. Accordingly, a higher value in the first range or the second range indicates weaker or lower performance conditions. In one embodiment, the lowest value in the second range is lower than the lowest value in the first range and the highest value in the second range is higher than the highest value in the first range. In one embodiment, the output signal of the ICU and the control signal derived therefrom include a plurality of control bits. Each combination of these control bits represents a corresponding level of performance conditions. The value of the control signal is used to adjust the strength of the input signal before it is driven to the output node of the buffer. In one embodiment, the output signal of the ICU is converted or translated into the control signal according to a predetermined conversion/translation scheme in which each bit combination representing the output signal of the ICU is converted/translated into a predetermined bit combination representing the control signal. Thus, each value in the first range is mapped or converted into a predetermined value in the second range. In one embodiment, the propagation of the input signal is delayed by a delay period based upon a delay control input. The teachings of the present invention are applicable to any scheme, mechanism, method and system for performance control and/or improvement of buffers. However, the present invention is not limited to buffer circuits and can also be applied to other circuits, components, or systems.

FIG. 1 shows a block diagram of one embodiment of a system configuration 100 in which the teachings of the present invention are implemented. The system configuration 100 includes a central processing unit (CPU) 101, a chipset unit 111, a graphics controller 121 coupled to a graphics subsystem 131, I/O devices 141, and a plurality of memory devices 151. For the purposes of the present specification, the term "processor" or "CPU" refers to any machine that is capable of executing a sequence of instructions and shall be taken to include, but not be limited to, general purpose microprocessors, special purpose microprocessors, multi-media controllers and microcontrollers, etc. In one embodiment, the CPU 101 is a general-purpose microprocessor that is capable of executing an Intel Architecture instruction set. The CPU 101 includes a buffer unit 105 that is used to facilitate data transfer between the CPU 101 and other components such as the chip set 111. In one embodiment, the chipset unit 111 may include a memory control unit (not shown) that is responsible for servicing memory transactions that target the system memory devices 151. In another embodiment, the memory control unit can be a stand-alone unit, or an integrated part of some larger unit that control the interface between various system components and the system memory devices 151. In one embodiment, the chipset unit 111 may also include an I/O control unit (not shown) that provides the interface control between the memory unit control unit and various I/O devices 141 including peripheral component interconnect (PCI) slots, PCI agents, a plurality of universal serial bus (USB) ports, a plurality of integrated drive electronics (IDE) ports, and other IO devices. The graphics controller 121 provides the interface control between the graphics subsystem 131 and the chipset unit 111.

Figure 2:
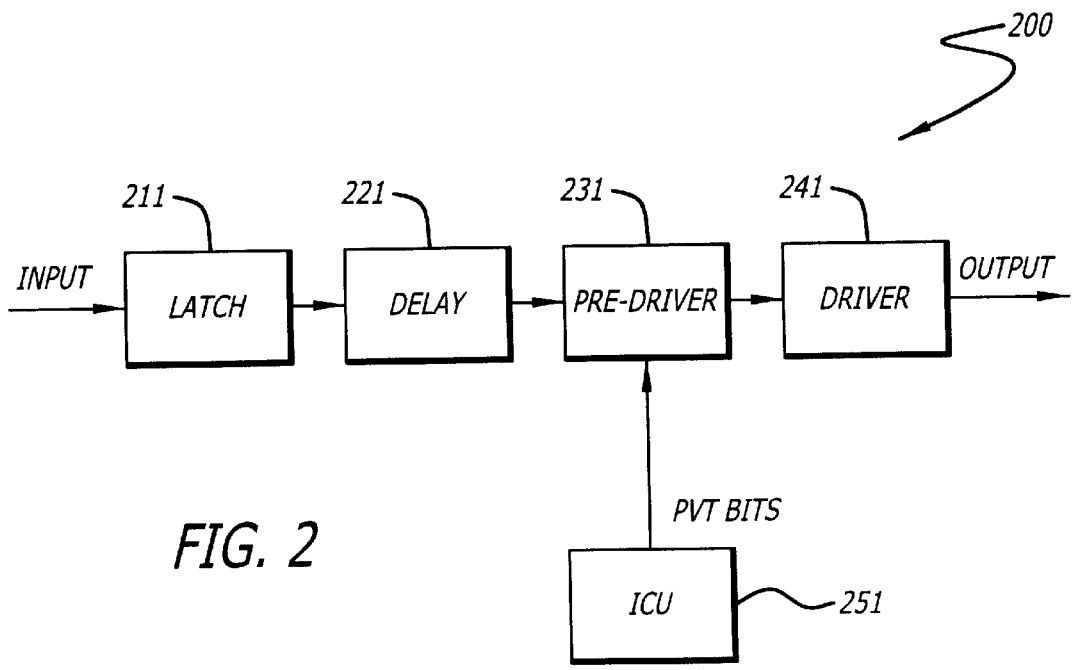
FIG. 2 shows a block diagram of one embodiment of a buffer circuit.

FIG. 2 illustrates a block diagram of one embodiment 200 of the buffer unit 105 shown in FIG. 1. The buffer unit 200 includes a latch unit 211, a delay unit 221, a pre-driver unit 231, and a driver unit 241. The latch 211, in one embodiment, coupled to receive an input signal or data and latch the input signal or data in response to a bus clock signal (not shown). The delay unit 221 receives the input signal from the latch unit 211 and adjustably delays the propagation of the signal for a corresponding period of time based upon a delay control input. The pre-driver unit 231 is coupled to the delay unit 221 to strengthen the input signal by a corresponding factor based upon an output signal of an impedance control unit (ICU) 251. The driver unit 241 drives the input signal to the output node 291.

Figure 3:
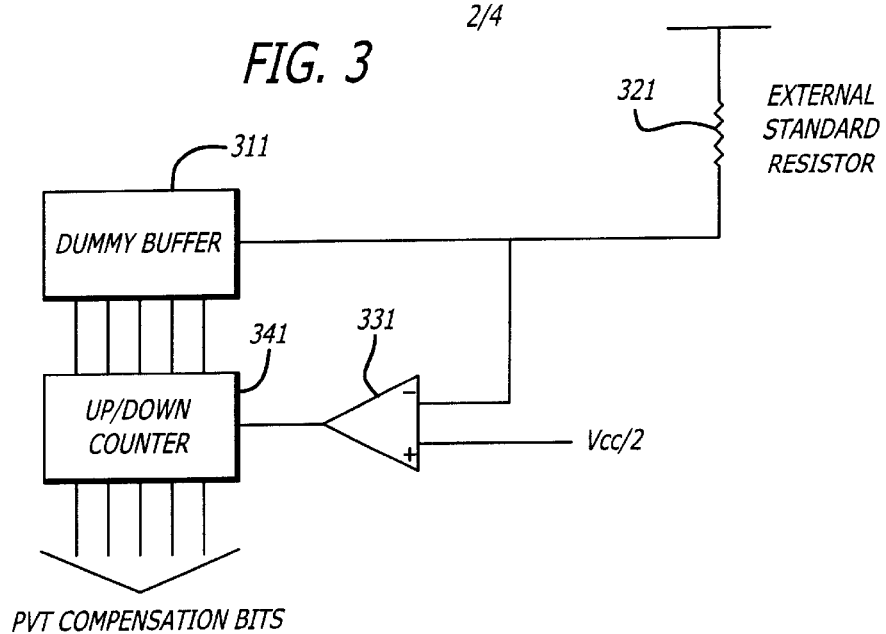
FIG. 3 illustrates a block a diagram of one embodiment of an impedance control unit (ICU)

In one embodiment, the output signal of the ICU 251 is generated by well-known techniques and contains five compensation bits that are used to compensate for variations in various performance conditions including variations in manufacturing process, operating voltage, and operating temperature (also referred to as PVT compensation bits or PVT bits herein). A more detailed block diagram of one embodiment of the ICU 251 is illustrated in FIG. 3. As shown in FIG. 3, the ICU 251 includes a dummy buffer 311, a high precision external resistor 321, a comparator 331, and a five-bit up/down counter 341. Functionally, the ICU compares the impedance of the dummy buffer 311 against the high precision resistor 321 to generate the five compensation bits. These bits turn the transistors in the multi-leg dummy buffer on or off in order to make the impedance of the dummy buffer equal to the external high precision resistor under different variations of the manufacturing process, operating voltage and operating temperature (PVT) conditions. Thus the five compensations bits generated by the ICU are a function of manufacturing process, operating voltage, and operating temperature. In one embodiment, the compensation bits are 01000 (decimal 8) in the FFFF corner and 10000 (decimal 16) in the RSSS corner. For other corners, the value of the compensation bits are in between 01000 (decimal 8) and 10000 (decimal 16).

As shown in FIG. 2, the PVT compensation bits generated by the ICU 251 are inputted into the pre-driver unit 231. As mentioned above, the pre-driver unit 231 strengthens the input signal by a factor corresponding to the value of the PVT compensation bits. Thus the strength of the pre-driver stage is controlled by the PVT compensation bits generated by the ICU 251 and will adjust itself accordingly based upon the PVT conditions. Currently, the values of the five compensation bits generated by the ICU 251 range from 01000 (decimal 8) in the FFFF corner and 10000 (decimal 16) in the RSSS corner. Thus a lower value of the PVT compensation bits corresponds to stronger or faster PVT performance conditions and a higher value of the PVT compensation bits corresponds to weaker or slower PVT performance conditions. As such, the strength of the input signal is increased by a smaller amount when the performance conditions are stronger and by a larger amount when the performance conditions are weaker in order to dynamically adjust the performance of the buffer under varying performance conditions. However, the swing of the PVT strength in this configuration only ranges from 8 in the FF corner to 16 in the RSSS corner. Had this swing been wider (e.g., 1 to 31), the benefits of using the PVT compensation bits to compensate for variations in the performance conditions would increase significantly. This is because the strength of the pre-driver stage would be more sensitive to changes in the performance conditions. Specifically, the bit combinations that would make the TCO window to be shrunk on both sides would be the ones that ensure the wider spread of the bit combinations across the FFFF corner and the RSSS corner. The wider is the spread, the better is the control or the tracking of the PVT conditions. The presence of the ESD resistors in series with the NMOS legs affects the buffer impedance significantly. As a result, the sensitivity of the PVT compensation bits across various PVT conditions is not great when the range of the combinations is small (e.g., 8 to 16). The bit combinations can be improved in the slower corner by passing them through a fixed offset of adder circuit. Unfortunately, the buffer timings can be improved either only on the fast corner or on the slow corner (but never both) using this technique. For example, the buffer at the slow corner (TCOMAX) will get better due to improved buffer strength if the compensation bits are improved by a fixed offset by passing them through an adder. However, this will negatively impact the buffer timings at the fast corner by making it too fast to satisfy the hold equation. Similarly, attempts to improve TCOMIN will deteriorate the TCOMAX of the buffer. The present invention provides a method and a mechanism to improve both TCOMIN and TCOMAX by making the buffer strength even stronger at the slow corner and yet weaker at the fast corner. According to the teachings of the present invention, a conversion/translator circuit is used to improve the spread of the compensation bit combinations across PVT corner. By increasing the spread of the compensation bit combinations, the strength of the pre-driver stage will be more sensitive to the variations in the performance conditions of the buffer. More specifically, in the fast corner, the strength of the buffer will be increased by a much smaller amount using the translator circuit (e.g., 1 instead of 8). In the slow corner, the strength of the buffer will be increased by a much larger amount using the translator circuit (e.g., 31 instead of 16). Thus the TCO window will be shrunk more on both sides using the translator circuit to improve the sensitivity of the pre-driver stage.

Figure 4:
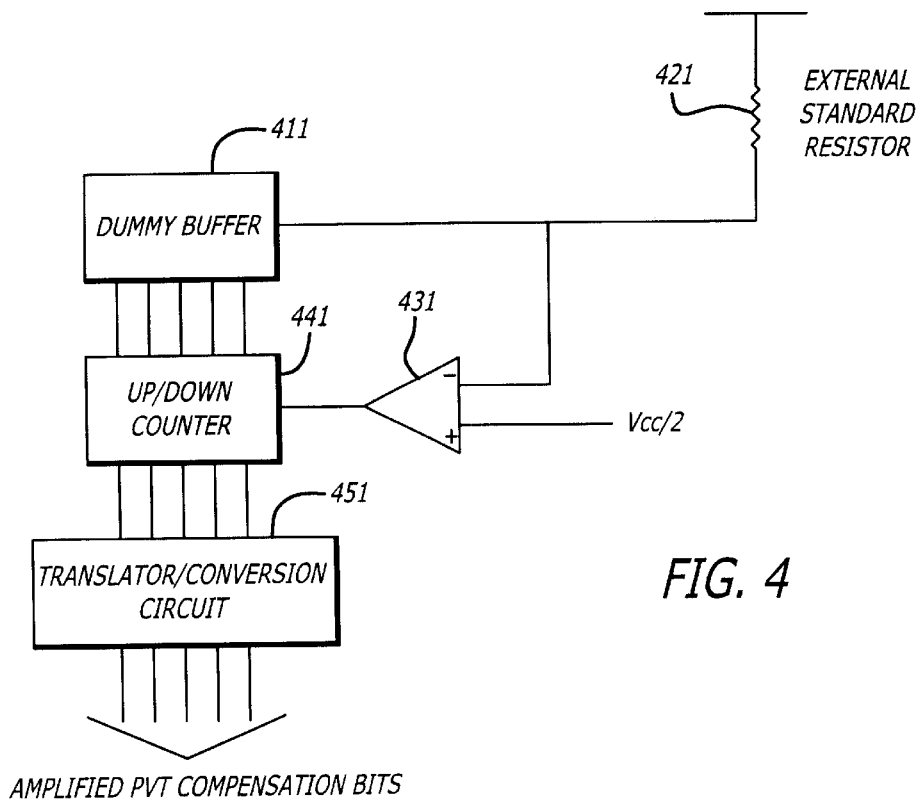
FIG. 4 shows a block diagram of one embodiment of an impedance control unit with a translator/conversion circuit to amplify the PVT compensation bits generated by the ICU.

FIG. 4 shows a block diagram of one embodiment of an impedance control unit in accordance with the teachings of the present invention. In this configuration, output values from the up/down counter 441 are inputted into a translator/conversion circuit 451. The output from the translator/conversion circuit 451 will then be inputted into the pre-driver circuit 231 to be used by the pre-driver circuit 231 to perform its corresponding function. In the present embodiment, the range of the output values from the ICU is converted by the translator circuit 451 into a wider range of values to be used by the pre-driver circuit 231 to adjust the strength of the buffer circuit. Thus, the strength of the buffer will be more sensitive to the variations in the performance conditions (e.g., PVT conditions). As mentioned above, the translator/conversion circuit 451 is used to translate the output from the ICU into the desired PVT bit combinations the value of which is used to adjust the strength of the input signal. For example, in one embodiment, the PVT bit combination for the fast corner will be converted from 01000 (decimal 8) into 00001 (decimal 1) and the PVT bit combination for the slow corner will be converted from 10000 (decimal 16) into 11111 (decimal 31). In one embodiment, the translator/conversion circuit 451 will map each value of the output of the ICU into a corresponding value according to a predetermined conversion scheme. An example of a conversion scheme is illustrated by a truth table in FIG. 5 below. It should be appreciated and understood that the conversion scheme and the corresponding truth table shown in FIG. 5 discussed herein are for explanation and illustration purposes and do not in anyway limit the scope of the present invention. The teachings of the present invention are fully applicable to other translation/conversion schemes that translate the output values of the ICU into other values to be used by the pre-driver circuit. For example, depending upon particular implementations of the present invention, multiple bit combinations other than 5-bit combinations may be used, output values from the ICU may be mapped into a different set of values than what is shown in FIG. 5, the range of output values from the ICU may be converted into a different range than what is shown in FIG. 5, etc.

Figures 5, 6:
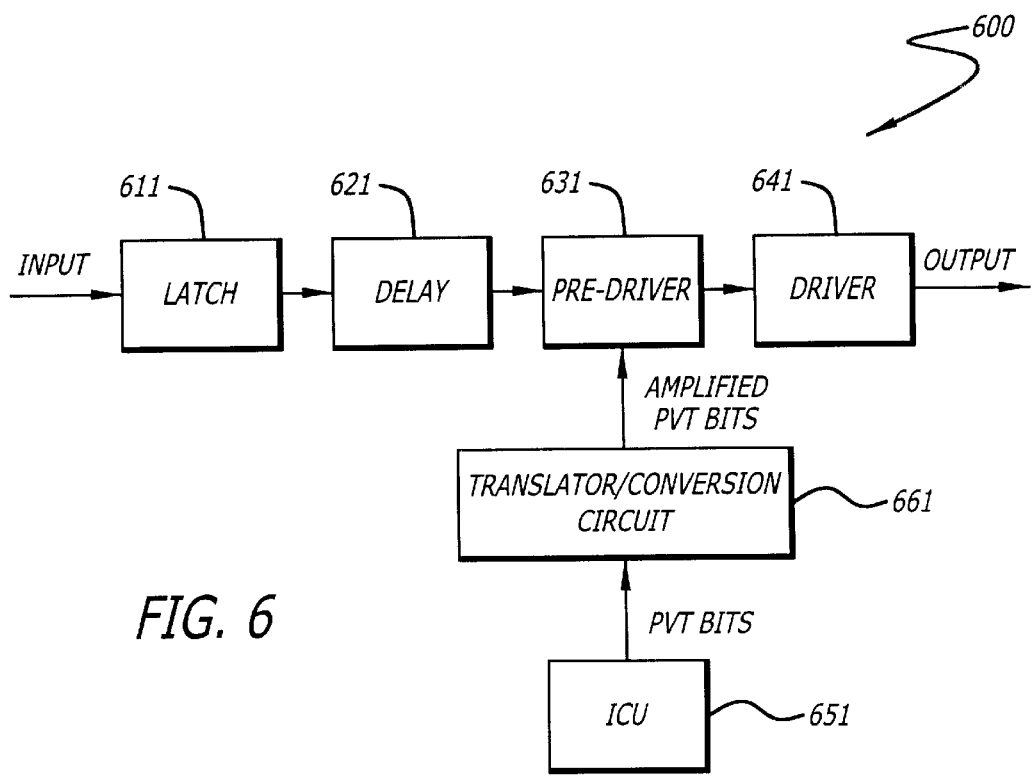
FIG. 5 shows a block diagram of one embodiment of a truth table specifying a conversion function to be performed upon the output of the ICU to generate a wider range of PVT compensated values.
FIG. 6 is a block diagram of one embodiment of a buffer circuit according to the teachings of the present invention.

FIG. 6 illustrates a block diagram of one embodiment 600 of the buffer unit 105 in which a translator/conversion circuit 661 is used to translate/convert the PVT bit combinations generated by the ICU 651 into the desired bit combinations to be used by the pre-driver circuit 631. As shown in FIG. 6, the buffer unit 600 includes a latch unit 611, a delay unit 621, a pre-driver unit 631, and a driver unit 641. The latch 611, in one embodiment, coupled to receive an input signal or data and latch the input signal or data in response to a bus clock signal (not shown). The delay unit 621 receives the input signal from the latch unit 611 and adjustably delays the propagation of the signal for a corresponding period of time based upon a delay control input. The pre-driver unit 631 is coupled to the delay unit 621 to strengthen the input signal by a corresponding factor based upon a control signal (also referred to as the amplified PVT bit combinations) generated by the translator/conversion circuit 661 based upon the output signal of an impedance control unit (ICU) 651. The driver unit 641 drives the input signal to the output node 691. Thus, in this embodiment of the present invention, the output of the ICU 651 is converted into a corresponding value according to a predetermined conversion scheme (e.g., as shown in FIG. 5) before being inputted into the pre-driver circuit 631. The translator/conversion circuit 661 may be implemented as part of the ICU unit 651, as part of the pre-driver unit 631, or as a standalone unit, depending upon the various implementations of the present invention. The translator/conversion circuit 661 may be implemented by well-known techniques using combinational gate logic.

Figure 7:
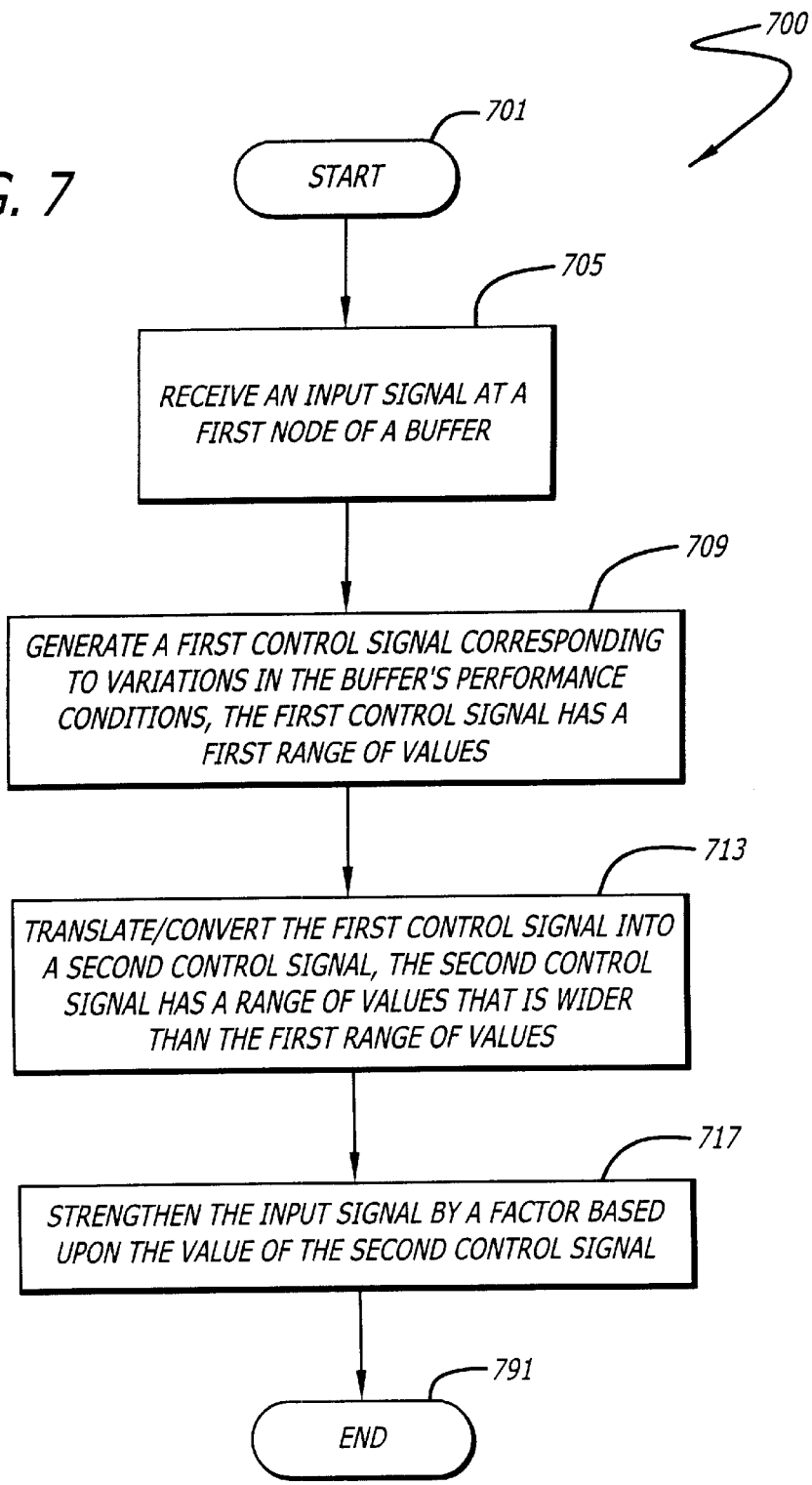
FIG. 7 shows a flow diagram of one embodiment of a method for improving the performance of a buffer circuit by increasing the sensitivity of PVT compensation bits.

FIG. 7 illustrates a flow diagram of one embodiment of a method according to the teachings of the present invention. At block 705, an input signal is received at a first node of a buffer circuit. At block 709, a first control signal corresponding to variations in the buffer's performance conditions (e.g., PVT performance conditions) is generated by an impedance control unit. The first control signal has a range of values each corresponds to a specific level of performance conditions. At block 713, the first control signal is translated/converted into a second control signal by a translator/conversion circuit. The second control signal has a range of values that is wider than the range of values associated with the first control signal. In one embodiment, the translation/conversion of the first control signal into the second control signal is performed by mapping each value of the first control signal into a corresponding value of the second control signal according to a predetermined conversion scheme (e.g., as shown in the truth table in FIG. 5). At block 717, the second control signal is inputted into a pre-driver unit of the buffer circuit. The pre-driver unit adjust the strength of the input signal by a factor corresponding to the value of the second control signal. Since the second control signal has a wider range of values than the first control signal, the use of the second control signal by the pre-driver unit results in more sensitivity to the variations in the performance conditions of the buffer circuit, thus better control or tracking of variations in performance conditions.

The invention has been described in conjunction with the preferred embodiment. It is evident that numerous alternatives, modifications, variations and uses will be apparent to those skilled in the art in light of the foregoing description.

What is claimed is:

1. A method comprising:
   receiving an input signal at a first node of a buffer; and
   strengthening the input signal by a factor corresponding to a control signal, the control signal being derived from an output signal of an impedance control unit that is used to compensate for variations in the buffer's performance parameters, the output signal of the impedance control unit having a first range of values corresponding to variations in the buffer's performance parameters, the control signal having a second range of values which is wider than the first range of values.

2. The method of claim 1 wherein variations in the buffer's performance parameters include variations in manufacturing process, variations in operating voltage, and variations in operating temperature.

3. The method of claim 1 wherein receiving the input signal comprises:
   latching the input signal in response to a clock signal.

4. The method of claim 1 wherein the lowest value in the second range is lower than the lowest value in the first range and the highest value in the second range is higher than the highest value in the first range.

5. The method of claim 1 wherein the output signal of the impedance control unit comprises a plurality of control bits the value of which corresponds to variations in the buffer's performance parameters.

6. The method of claim 5 wherein the control signal comprises a plurality of control bits the value of which is used to adjust the strength of the input signal.

7. The method of claim 5 wherein a lower value in the first range corresponds to the buffer's stronger performance conditions and a higher value in the first range corresponds to the buffer's weaker performance conditions.

8. The method of claim 1 further comprising:

converting the output signal of the impedance control unit into the control signal according to a predetermined conversion scheme.

9. The method of claim 1 wherein a bit combination representing a value of the output signal of the impedance control unit is converted into a predetermined bit combination representing a value of the control signal.

10. The method of claim 1 further comprising:

delaying the propagation of the input signal from the first node to a second node by a delay period based upon a delay control input; and driving the input signal to an output node of the buffer.

11. A buffer circuit comprising:

a pre-driver unit to strengthen an input signal being propagated from a first node to a second node in the buffer circuit based upon a control signal, the control signal being derived from an output signal of an impedance control unit that is used to compensate for variations in the performance conditions of the buffer circuit, the output signal of the impedance control unit having a first range of values corresponding to variations in the performance conditions of the buffer circuit, the control signal having a second range of values which is larger than the first range of values.

12. The buffer circuit of claim 11 wherein the variations in the performance conditions include variations in manufacturing process, variations in operating voltage, and variations in operating temperature.

13. The buffer circuit of claim 12 wherein the lowest value in the second range is lower than the lowest value in the first range and the highest value in the second range is higher than the highest value in the first range.

14. The buffer circuit of claim 13 wherein the output signal of the impedance control unit comprises a plurality of control bits the value of which corresponds to variations in the buffer's performance parameters.

15. The buffer circuit of claim 14 wherein the control signal comprises a plurality of control bits the value of which is used to adjust the strength of the input signal.

16. The buffer circuit of claim 15 wherein a lower value in the first range corresponds to the buffer's higher performance conditions and a higher value in the first range corresponds to the buffer's lower performance conditions.

17. The buffer circuit of claim 11 further comprising:

a conversion circuit to convert the output signal of the impedance control unit into the control signal according to a predetermined conversion scheme.

18. The buffer circuit of claim 17 wherein each bit combination representing a value of the output signal of the impedance control unit is converted into a predetermined bit combination representing a value of the strength control signal.

19. A buffer circuit comprising:

an input latch to latch an input signal in response to a clock signal;

a delay circuit to delay the propagation of the input signal from a first node to a second node in the buffer circuit based upon a delay control signal corresponding to a selected delay period;

a pre-driver circuit coupled to the delay circuit to strengthen the input signal based upon a strength control signal derived from an output signal of an impedance control unit, the output signal of the impedance control unit having a first range of values corresponding to variations in the performance conditions of the buffer circuit, the strength control signal having a second range of values which is larger than the first range of values; and a driver circuit coupled to the pre-driver circuit to drive the input signal to an output node of the buffer circuit.

20. The buffer circuit of claim 19 further comprising:

a conversion circuit to convert the output signal of the impedance control unit into the strength control signal to be used by the pre-driver circuit in performing its corresponding function.

21. The buffer circuit of claim 20 wherein a bit combination representing a value in the first range is converted into a predetermined bit combination representing a value in the second range.

22. A processor comprising:

a buffer circuit to facilitate data transfer between the processor and another device, the buffer circuit comprising:

a pre-driver unit to strengthen an input signal being propagated from a first node to a second node in the buffer circuit based upon a control signal, the control signal being derived from an output signal of an impedance control unit that is used to compensate for variations in the performance conditions of the buffer circuit, the output signal of the impedance control unit having a first range of values corresponding to variations in the performance conditions of the buffer circuit, the control signal having a second range of values which is larger than the first range of values.

23. The processor of claim 22 wherein the variations in the performance conditions include variations in manufacturing process, variations in operating voltage, and variations in operating temperature.

24. The processor of claim 22 further comprising:

a conversion circuit to convert the output signal of the impedance control unit into the control signal according to a predetermined conversion scheme.

25. The processor of claim 24 wherein each bit combination representing a value of the output signal is converted into a predetermined bit combination representing a corresponding value of the control signal.

* * * * *